United States Patent
Kitajima

(10) Patent No.: US 9,948,269 B2
(45) Date of Patent: Apr. 17, 2018

(54) HIGH-FREQUENCY MODULE

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/396,863

(22) Filed: Jan. 3, 2017

(65) Prior Publication Data

US 2017/0149469 A1    May 25, 2017

Related U.S. Application Data

(63) Continuation of application No. PCT/JP2015/070223, filed on Jul. 15, 2015.

(30) Foreign Application Priority Data

Jul. 15, 2014  (JP) ................. 2014-145200

(51) Int. Cl.
*H03H 7/46* (2006.01)
*H03H 7/38* (2006.01)
(Continued)

(52) U.S. Cl.
CPC .............. *H03H 7/38* (2013.01); *H04B 1/006* (2013.01); *H05K 1/02* (2013.01); *H05K 1/025* (2013.01);
(Continued)

(58) Field of Classification Search
CPC .......... H03H 9/706; H03H 9/725; H03H 7/46; H03H 7/463; H05K 1/0246; H05K 1/025
See application file for complete search history.

(56) References Cited

U.S. PATENT DOCUMENTS 9,413,413 B2 * 8/2016 Murase .................. H04B 1/44
9,774,312 B2 * 9/2017 Iwanaga ................. H03H 7/38
(Continued)

FOREIGN PATENT DOCUMENTS

JP    2006-340257 A    12/2006
JP    2013-247438 A    12/2013
(Continued)

OTHER PUBLICATIONS

Official Communication issued in corresponding International Application PCT/JP2015/070223, dated Sep. 1, 2015.

*Primary Examiner* — Duc M Nguyen
(74) *Attorney, Agent, or Firm* — Keating & Bennett, LLP

(57) ABSTRACT

A high-frequency module includes a wiring board, a first duplexer that separates a transmission signal and a reception signal in a first frequency band, and a second duplexer that separates a transmission signal and a reception signal in a second frequency band whose reception-side frequency band partially overlaps with a frequency band of a third-order harmonic of the first transmission signal. The first duplexer is disposed near a predetermined side on a first main surface of the wiring board, and the second duplexer is disposed near an opposite side opposing the predetermined side. An extended line extending from a first transmission terminal of the first duplexer and an extended line extending from a second reception terminal of the second duplexer are spaced away from each other.

20 Claims, 5 Drawing Sheets

(51) Int. Cl.
  *H05K 1/02* (2006.01)
  *H05K 1/18* (2006.01)
  *H04B 1/00* (2006.01)
  *H03H 9/72* (2006.01)
  *H04B 1/50* (2006.01)
  *H04B 15/00* (2006.01)

(52) U.S. Cl.
  CPC ............. *H05K 1/0243* (2013.01); *H05K 1/18* (2013.01); *H03H 7/463* (2013.01); *H03H 9/725* (2013.01); *H04B 1/50* (2013.01); *H04B 15/00* (2013.01)

(56) References Cited

U.S. PATENT DOCUMENTS

| | | | | |
|---|---|---|---|---|
| 2004/0171356 | A1* | 9/2004 | Uriu | .................. H04B 1/005 |
| | | | | 455/83 |
| 2005/0264375 | A1* | 12/2005 | Ikuta | .................. H03H 9/725 |
| | | | | 333/133 |
| 2006/0276158 | A1 | 12/2006 | Okabe | |
| 2012/0194294 | A1* | 8/2012 | Nishizawa | ........... H03H 9/0571 |
| | | | | 333/133 |
| 2013/0272176 | A1 | 10/2013 | Uejima | |
| 2013/0314170 | A1 | 11/2013 | Yamaguchi et al. | |
| 2013/0328640 | A1* | 12/2013 | Tsutsumi | ............... H03H 7/463 |
| | | | | 333/133 |
| 2014/0044022 | A1 | 2/2014 | Matsuo et al. | |
| 2014/0091877 | A1* | 4/2014 | Uejima | ................ H03H 9/0576 |
| | | | | 333/133 |
| 2015/0180450 | A1* | 6/2015 | Yamaji | ............... H03H 9/14535 |
| | | | | 333/134 |
| 2016/0197643 | A1* | 7/2016 | Uejima | .................... H01P 5/16 |
| | | | | 455/73 |
| 2017/0338800 | A1* | 11/2017 | Uejima | .................... H03H 7/38 |

FOREIGN PATENT DOCUMENTS

| | | |
|---|---|---|
| JP | 2014-036409 A | 2/2014 |
| WO | 2012/093539 A1 | 7/2012 |

* cited by examiner

HIGH-FREQUENCY MODULE

CROSS REFERENCE TO RELATED APPLICATIONS

This application claims the benefit of priority to Japanese Patent Application No. 2014-145200 filed on Jul. 15, 2014 and is a Continuation Application of PCT Application No. PCT/JP2015/070223 filed on Jul. 15, 2015. The entire contents of each application are hereby incorporated herein by reference.

BACKGROUND OF THE INVENTION

1. Field of the Invention

The present invention relates to a high-frequency module in which a plurality of duplexers that separate transmission and reception signals in mutually-different frequency bands are provided.

2. Description of the Related Art

Nowadays, cellular phones and the like require higher capacities and higher communication speeds, leading to the exploration of carrier aggregation (CA), which simultaneously uses a plurality of communication systems of different frequency bands and, as a single communication line, transmits and receives data in a distributed manner. In a front-end module, which is provided in a location near an antenna in this type of communication device, a plurality of filter circuits, branching circuits, and the like are provided on a wiring board so that signals in a plurality of different frequency bands can be transmitted and received simultaneously.

For example, a module 100 disclosed in Japanese Unexamined Patent Application Publication No. 2006-340257 is configured to be capable of handling both W-CDMA and GSM (registered trademark) communication systems. As illustrated in FIG. 9, in the module 100, a duplexer 102 that separates W-CDMA transmission signals and reception signals, a transmission filter 103 for GSM (registered trademark) transmission signals, and two reception filters 104 and 105 for GSM (registered trademark) reception signals, are mounted on a first main surface of a wiring board 101. Meanwhile, a plurality of mounting electrodes for mounting the high-frequency module 100 onto an external motherboard or the like are provided on a second main surface of the wiring board 101, and transmission and reception terminals of the duplexer 102 and terminals of the transmission filter 103 and the reception filters 104 and 105 are connected to predetermined mounting electrodes by extended lines of the wiring board 101.

Incidentally, when transmitting and receiving using a plurality of communication systems of different frequency bands, there are cases where the frequency band of communication signals (transmission signals and reception signals) used in one communication system partially overlaps with a frequency band of a harmonic of a communication signal used in another communication system. Here, in the case where one of the communication signals is a transmission signal and the other signal that overlaps with the frequency band of the harmonic of the stated transmission signal is a reception signal, there is a risk of signal interference arising and causing a drop in reception sensitivity.

In the conventional module 100, the terminals of the duplexer 102, the transmission and reception filters 103 to 105, and so on are connected to corresponding predetermined mounting electrodes on the second main surface of the wiring board 101 by the extended lines, as described above. Accordingly, in the case where an extended line through which a transmission signal of one communication system passes is disposed near an extended line through which a reception signal overlapping with the frequency band of a harmonic of the stated transmission signal passes, there is a risk of interference arising between the signals and causing a drop in reception sensitivity. A similar drop in reception sensitivity may also occur in the case where the terminals of the duplexer 102, the filters 103 to 105, and so on through which these signals pass are disposed near one another.

SUMMARY OF THE INVENTION

Preferred embodiments of the present invention improve isolation characteristics between transmission and reception terminals in a high-frequency module that uses transmission and reception signals of a plurality of different frequency bands.

A high-frequency module according to a preferred embodiment of the present invention includes a wiring board that is rectangular or substantially rectangular when viewed in plan view; a first duplexer including a first transmission terminal to which a transmission signal in a first transmission frequency band is inputted, a first common terminal that outputs the transmission signal inputted to the first transmission terminal and to which a reception signal in a first reception frequency band is inputted, and a first reception terminal that outputs the reception signal inputted to the first common terminal; and a second duplexer including a second transmission terminal to which a transmission signal in a second transmission frequency band is inputted, a second common terminal that outputs the transmission signal inputted to the second transmission terminal and to which a reception signal in a second reception frequency band is inputted, and a second reception terminal that outputs the reception signal inputted to the second common terminal. The second reception frequency band partially overlaps with a frequency band of a harmonic of the transmission signal in the first transmission frequency band. The first duplexer is disposed closer to a predetermined side on a first main surface of the wiring board, and the second duplexer is disposed closer to an opposite side opposing the predetermined side. An extended line extending from the first transmission terminal and an extended line extending from the second reception terminal, provided in or on the wiring board, are spaced away from each other.

According to this configuration, the first duplexer and the second duplexer are able to be spaced away from each other. In this case, the first transmission terminal of the first duplexer through which a transmission signal in the first transmission frequency band passes and the second reception terminal of the second duplexer through which a reception signal in the second reception frequency band passes are spaced away from each other. This significantly reduces or prevents signal interference that affects the degradation of high-frequency characteristics, such as reception sensitivity, and makes it possible to improve isolation characteristics between the respective signal terminals. Additionally, by extending the extended line from the first transmission terminal and the extended line from the second reception terminal away from each other, the two extended lines are able to be prevented from being near each other in the wiring board, which makes it possible to further improve the isolation characteristics between the respective signal terminals.

Additionally, a high-frequency module according to a preferred embodiment of the present invention may further include a first transmission electrode provided on a second main surface of the wiring board and connected to the extended line extending from the first transmission terminal; and a second reception electrode provided on the second main surface of the wiring board and connected to the extended line extending from the second reception terminal. Here, the first transmission electrode may be disposed near the predetermined side of the wiring board, and the second reception electrode may be disposed near the opposite side of the wiring board. In this case, the first transmission electrode through which the transmission signal in the first transmission frequency band passes and the second reception electrode through which the reception signal in the second reception frequency band passes are able to be spaced away from each other. This significantly reduces or prevents signal interference that affects the degradation of high-frequency characteristics, such as reception sensitivity, and makes it possible to improve isolation characteristics between the respective signal terminals.

Additionally, the first transmission terminal may be disposed toward the predetermined side of the wiring board, and the second reception terminal may be disposed toward the opposite side of the wiring board. In this case, the first transmission terminal of the first duplexer and the second reception terminal of the second duplexer are spaced away from each other, and thus isolation characteristics between the first transmission terminal and the second reception terminal are improved.

Additionally, a high-frequency module according to a preferred embodiment of the present invention may further include a third duplexer including a third transmission terminal to which a transmission signal in a third transmission frequency band is inputted, a third common terminal that outputs the transmission signal inputted to the third transmission terminal and to which a reception signal in a third reception frequency band is inputted, and a third reception terminal that outputs the reception signal inputted to the third common terminal; a third reception electrode provided on the second main surface of the wiring board and electrically connected to the third reception terminal; and a ground electrode provided on the second main surface of the wiring board. Here, the second reception frequency band and the third reception frequency band may partially overlap, and the ground electrode may be disposed between the second reception electrode and the third reception electrode.

In this manner, a signal leaking from the second reception electrode and the third reception electrode flows to the ground electrode. In this case, mutual interference of the reception signals is able to be prevented, which makes it possible to improve the isolation characteristics between the second reception terminal and the third reception terminal.

Additionally, the third duplexer may be disposed on the first main surface of the wiring board, near the opposite side. In this case, the first duplexer and the third duplexer are able to be spaced away from each other, and thus interference between the duplexers is prevented.

Additionally, the second duplexer and the third duplexer may be disposed near each other. In this case, the high-frequency module is able to be made smaller.

Additionally, a high-frequency module according to a preferred embodiment of the present invention may further include a fourth duplexer including a fourth transmission terminal to which a transmission signal in a fourth transmission frequency band is inputted, a fourth common terminal that outputs the transmission signal inputted to the fourth transmission terminal and to which a reception signal in a fourth reception frequency band is inputted, and a fourth reception terminal that outputs the reception signal inputted to the fourth common terminal; a switch IC disposed on the first main surface of the wiring board and electrically connected to the fourth common terminal; a fourth reception electrode provided on the second main surface of the wiring board and electrically connected to the fourth reception terminal; and a ground mounting electrode provided on the second main surface of the wiring board. The fourth common terminal may be disposed closer to the switch IC than the fourth reception terminal. The fourth reception electrode may be disposed between the fourth common terminal and the switch IC when viewed in plan view. The ground mounting electrode may be disposed between the fourth reception terminal and the fourth reception electrode when viewed in plan view.

In this case, an extended line that connects the fourth reception terminal and the fourth reception electrode is extended from the fourth reception terminal toward the fourth common terminal, and thus the distance between the extended line and the fourth common terminal becomes short. Additionally, the reception signal inputted from the fourth common terminal passes through the fourth reception terminal and is then led toward the fourth common terminal by the extended line connecting the fourth reception terminal and the fourth reception electrode, and thus that extended line defines a return path for the reception signal. However, this wiring structure is susceptible to concentrations of current near the fourth reception terminal, the fourth reception electrode, and the extended line. In the case where current concentrates, it becomes easy for the transmission signal outputted from the fourth common terminal to leak to the extended line, the reception signal passing through that extended line to leak to connection wires and the like that connect the fourth common terminal and the switch IC, and so on, leading to a drop in the isolation characteristics in the fourth duplexer.

Accordingly, the ground mounting electrode provided on the second main surface of the wiring board is disposed between the fourth reception terminal and the fourth reception electrode when viewed in plan view. By doing so, any current concentrating near the fourth reception terminal, the fourth reception electrode, and the extended line is significantly reduced or prevented by the ground mounting electrode, and thus the isolation characteristics between the transmission and reception terminals of the fourth duplexer, between the fourth duplexer and the other duplexers, and so on are improved.

Additionally, the fourth reception electrode may be disposed near the opposite side of the wiring board, and the fourth duplexer may be disposed in a position farther from the opposite side of the wiring board than the second duplexer. In the case where the fourth duplexer and the fourth reception electrode are both disposed near the opposite side of the wiring board, it is easy for current to concentrate near the fourth reception terminal, the fourth reception electrode, and the extended line due to the effects of the extended line and the like connecting the fourth reception terminal and the fourth reception electrode. Accordingly, by disposing the fourth duplexer in a position farther from the opposite side of the wiring board than the second duplexer, the fourth duplexer and the fourth reception electrode are separated, making it possible to significantly reduce or prevent current buildup that affects the degradation of the isolation characteristics.

Additionally, a high-frequency module according to a preferred embodiment of the present invention may further include a fifth duplexer including a fifth transmission terminal to which a transmission signal in a fifth transmission frequency band is inputted, a fifth common terminal that outputs the transmission signal inputted to the fifth transmission terminal and to which a reception signal in a fifth reception frequency band is inputted, and a fifth reception terminal that outputs the reception signal inputted to the fifth common terminal; a switch IC disposed on the first main surface of the wiring board and electrically connected to the fifth common terminal; and a fifth reception electrode provided on the second main surface of the wiring board and electrically connected to the fifth reception terminal. The fifth common terminal may be disposed closer to the switch IC than the fifth reception terminal. The fifth reception electrode may be located farther from the switch IC than the fifth duplexer when viewed in plan view.

Disposing the fifth reception electrode in this manner makes it unnecessary to extend an extended line connecting the fifth reception terminal to the fifth reception electrode toward the fifth common terminal. Accordingly, any current concentrating near the fifth reception terminal, the fifth reception electrode, and the extended line connecting those elements is significantly reduced or prevented, and thus the isolation characteristics between the transmission and reception terminals of the fifth duplexer, between the fifth duplexer and the other duplexers, and so on are improved.

Additionally, a component may be disposed between the first duplexer and the second duplexer. In this case, the first duplexer and the second duplexer are able to be spaced from each other, and the isolation characteristics between the duplexers are improved.

With preferred embodiments of the present invention, interference between a transmission signal and a reception signal, which affects the degradation of high-frequency characteristics such as reception sensitivity, is significantly reduced or prevented, and thus isolation characteristics between a transmission signal terminal and a reception signal terminal are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
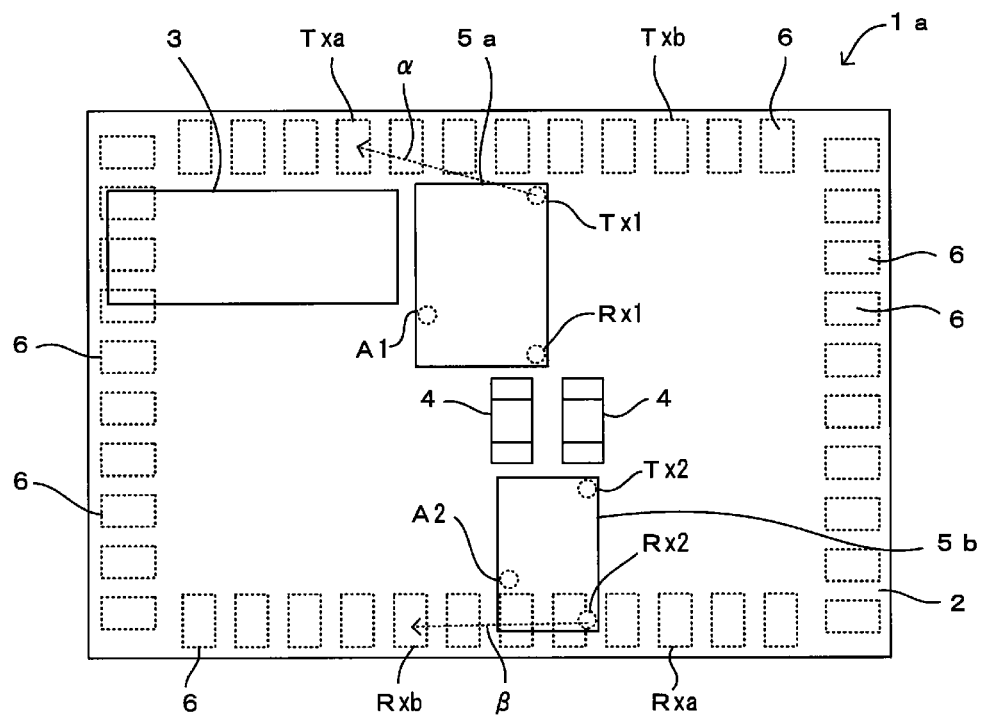
FIG. 1 is a plan view of a high-frequency module according to a first preferred embodiment of the present invention.
Figure 2:
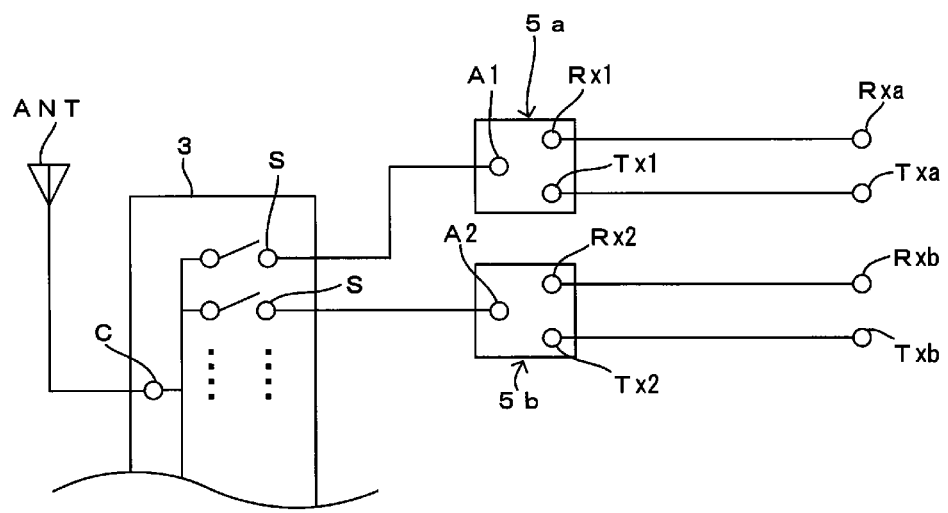
FIG. 2 is a configuration diagram illustrating the high-frequency module illustrated in FIG. 1.

A high-frequency module $1a$ according to a first preferred embodiment of the present invention will be described with reference to FIGS. 1 and 2. FIG. 1 is a plan view of the high-frequency module $1a$, and FIG. 2 is a configuration diagram illustrating the high-frequency module $1a$. Note that FIG. 1 and illustrate only some elements, namely those related to the present preferred embodiment.

The high-frequency module $1a$ according to the present preferred embodiment is a front-end module disposed in a location near an antenna of a communication device such as a cellular phone, and includes a wiring board 2, as well as a switch IC 3, chip components 4 such as chip inductors, chip capacitors, and so on defining an impedance matching circuit and the like, and a plurality of duplexers $5a$ and $5b$, each mounted on a first main surface of the wiring board 2. The high-frequency module $1a$ is capable of handling carrier aggregation (CA), which realizes higher capacities and higher communication speeds by simultaneously using a plurality of communication systems of different frequency bands. Note that in this preferred embodiment, the plurality of duplexers $5a$ and $5b$ preferably separate transmission signals and reception signals on a communication system-by-communication system basis.

The wiring board 2 is preferably made of a glass epoxy resin, a ceramic material, or the like, and preferably is rectangular or substantially rectangular when viewed in plan view, for example. Mounting electrodes (not illustrated) to mount the switch IC 3, the chip components 4, and the plurality of duplexers $5a$ and $5b$ are provided on the first main surface, and a plurality of outer electrodes 6 to connect to an external motherboard or the like are provided on a second main surface. Note that in this preferred embodiment, the plurality of outer electrodes 6 are preferably arranged in a row along an outer edge portion or portions of the second main surface of the wiring board 2.

The switch IC 3 includes a common terminal C connected to an antenna ANT and a plurality of switching terminals S, and connects or disconnects the common terminal C to at least one of the switching terminals S.

Of the plurality of duplexers $5a$ and $5b$ mounted on the wiring board 2, a first duplexer $5a$, for example, includes a first transmission terminal Tx1 to which a transmission signal in a first transmission frequency band is inputted, a first common terminal A1 that outputs the transmission signal inputted to the first transmission terminal Tx1 and to which a reception signal in a first reception frequency band is inputted, and a first reception terminal Rx1 that outputs the reception signal inputted to the first common terminal A1. Here, the first common terminal A1 is connected to a predetermined switching terminal S of the switch IC 3 by a wire electrode provided in or on the wiring board 2, the first transmission terminal Tx1 is connected to a first transmission electrode Txa, which is one of the outer electrodes 6, by an extended line provided in or on the wiring board 2, and the first reception terminal Rx1 is connected to a first reception electrode Rxa, which is also one of the outer electrodes 6, by an extended line provided in or on the wiring board 2. Note that in this preferred embodiment, the first transmission frequency band preferably is set to about 704 MHz to about 716 MHz and the first reception frequency band preferably is set to about 734 MHz to about 746 MHz, and the first duplexer 5a is provided for a communication system using what is known as the Band 17 frequency band, for example.

A second duplexer 5b includes a second transmission terminal Tx2 to which a transmission signal in a second transmission frequency band is inputted, a second common terminal A2 that outputs the transmission signal inputted to the second transmission terminal Tx2 and to which a reception signal in a second reception frequency band is inputted, and a second reception terminal Rx2 that outputs the reception signal inputted to the second common terminal A2. Here, the first common terminal A2 is connected to a predetermined switching terminal S of the switch IC 3 by a wire electrode provided in or on the wiring board 2, the second transmission terminal Tx2 is connected to a second transmission electrode Txb, which is one of the outer electrodes 6, by an extended line provided in or on the wiring board 2, and the second reception terminal Rx2 is connected to a second reception electrode Rxb, which is also one of the outer electrodes 6, by an extended line provided in or on the wiring board 2. Note that in the second duplexer 5b, the second transmission frequency band preferably is set to about 1710 MHz to about 1755 MHz and the second reception frequency band preferably is set to about 2110 MHz to about 2155 MHz, and the second duplexer 5b is provided for a communication system using what is known as the Band 4 frequency band, for example.

The chip components 4, which are included in the impedance matching circuit that performs impedance matching between the switch IC 3 and the first duplexer 5a or between the switch IC 3 and the second duplexer 5b, are disposed on the first main surface of the wiring board 2, between the first duplexer 5a and the second duplexer 5b when viewed in plan view.

Incidentally, the Band 4 reception frequency band (the second reception frequency band: about 2110 MHz to about 2155 MHz) partially overlaps with the frequency band of a third-order harmonic (about 2112 MHz to about 2148 MHz) of the Band 17 transmission frequency band (the first transmission frequency band: about 704 MHz to about 716 MHz). In such a case, when the third-order harmonic of the Band 17 transmission signal interferes with the Band 4 reception signal, there is a risk of a drop in the reception sensitivity of the communication system that uses the Band 4 frequency band. Accordingly, this preferred embodiment reduces or prevents such a drop in reception sensitivity.

Specifically, as illustrated in FIG. 1, the first duplexer 5a is disposed near a predetermined side of the wiring board 2, which is rectangular or substantially rectangular when viewed in plan view, and the second duplexer 5b is disposed near the side opposite from the stated predetermined side. Additionally, the first transmission electrode Txa connected to the first transmission terminal Tx1 of the first duplexer 5a by the extended line is disposed in a position, on an outer edge portion of the second main surface of the wiring board 2, that is near the predetermined side. The second reception electrode Rxb connected to the second reception terminal Rx2 of the second duplexer 5b by the extended line is disposed in a position, on an outer edge portion of the second main surface of the wiring board 2, that is near the stated opposite side. Note that in this preferred embodiment, the above-described predetermined side is one of two long sides of the wiring board 2, which is a horizontally-elongated rectangle when viewed in plan view, and is the side located on the top in FIG. 1.

Thus, according to the present preferred embodiment as described above, the first duplexer 5a and the second duplexer 5b are able to be disposed with a sufficient distance therebetween by disposing the first duplexer 5a near the predetermined side of the wiring board 2 and disposing the second duplexer 5b near the side opposite from the predetermined side of the wiring board 2. In this case, the first transmission terminal Tx1 through which the Band 17 transmission signal passes is able to be disposed far away from the second reception terminal Rx2 through which the Band 4 reception signal, which partially overlaps with the frequency band of the third-order harmonic of the stated transmission signal, passes. This significantly reduces or prevents signal interference that affects the degradation of high-frequency characteristics, such as reception sensitivity, and makes it possible to improve isolation characteristics between the respective signal terminals. Additionally, by extending the extended line from the first transmission terminal Tx1 and the extended line from the second reception terminal Rx2 to be spaced away from each other, the two extended lines are prevented from being near each other in the wiring board 2, which makes it possible to further improve the isolation characteristics between the respective signal terminals.

Additionally, by disposing the first transmission electrode Txa near the predetermined side of the wiring board 2 and disposing the second reception electrode Rxb near the opposite side of the wiring board 2, the first transmission electrode Txa through which the Band 17 transmission signal passes and the second reception electrode Rxb through which the Band 4 reception signal passes are able to be sufficiently spaced from each other. This significantly reduces or prevents signal interference that affects the degradation of high-frequency characteristics, such as reception sensitivity, and makes it possible to improve isolation characteristics between the respective signal terminals.

Additionally, by disposing the first transmission terminal Tx1 toward the predetermined side of the wiring board 2 and disposing the second reception terminal Rx2 toward the opposite side of the wiring board 2, the distance between the first transmission terminal Tx1 and the second reception terminal Rx2 is able to be increased even more, which makes it possible to further improve the isolation characteristics.

Additionally, the first transmission terminal Tx1 and the second reception terminal Rx2 are both disposed slightly farther inward in the wiring board 2, when viewed in plan view, than the outer electrodes to which those terminals are connected (that is, the first transmission electrode Txa or the second reception electrode Rxb). Through this configuration, the extended line from the first transmission terminal Tx1 (see arrow α in FIG. 1) and the extended line from the second reception terminal Rx2 (see arrow β in FIG. 1) are spaced away from each other, which makes it possible to further improve the isolation characteristics. Note that the extended line from the first transmission terminal Tx1 and the extended line from the second reception terminal Rx2 extending away from each other refers to extending in directions where the arrow α and the arrow β in FIG. 1 will not intersect even if those arrows are extended. For example, in FIG. 1, the first transmission electrode Txa may be disposed farther to the right than the first transmission terminal Tx1.

Additionally, by disposing the chip components 4 between the first duplexer 5a and the second duplexer 5b, the duplexers 5a and 5b are able to be sufficiently spaced from each other, which makes it possible to improve the isolation characteristics between the duplexers 5a and 5b.

Second Preferred Embodiment

Figure 3:
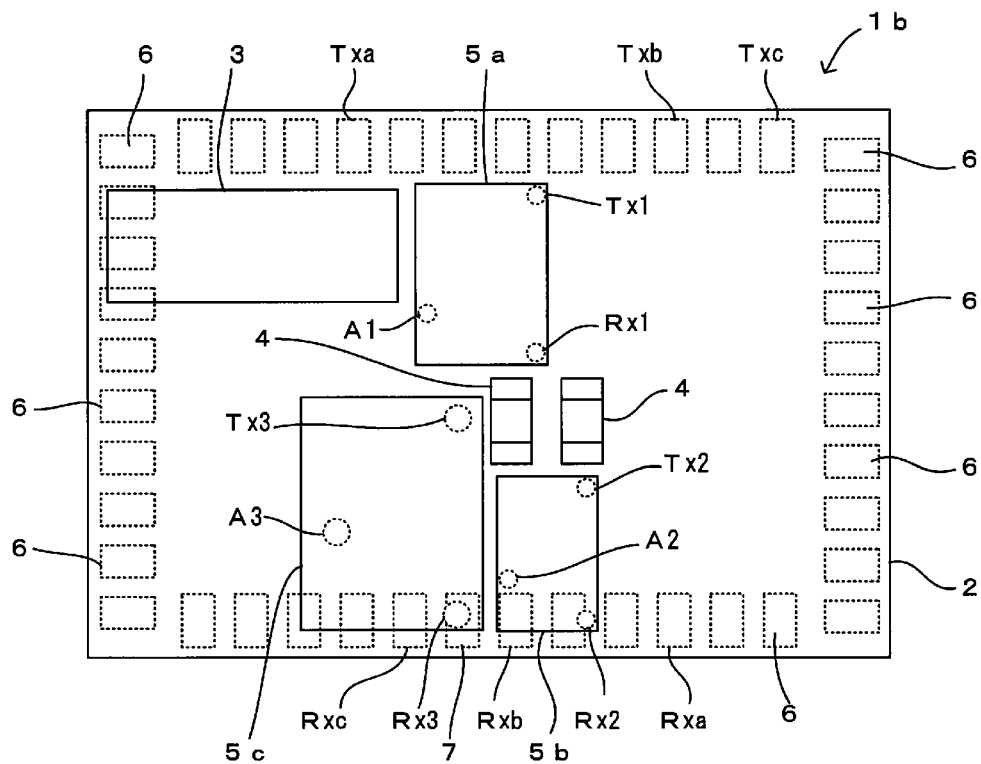
FIG. 3 is a plan view of a high-frequency module according to a second preferred embodiment of the present invention.
Figure 4:
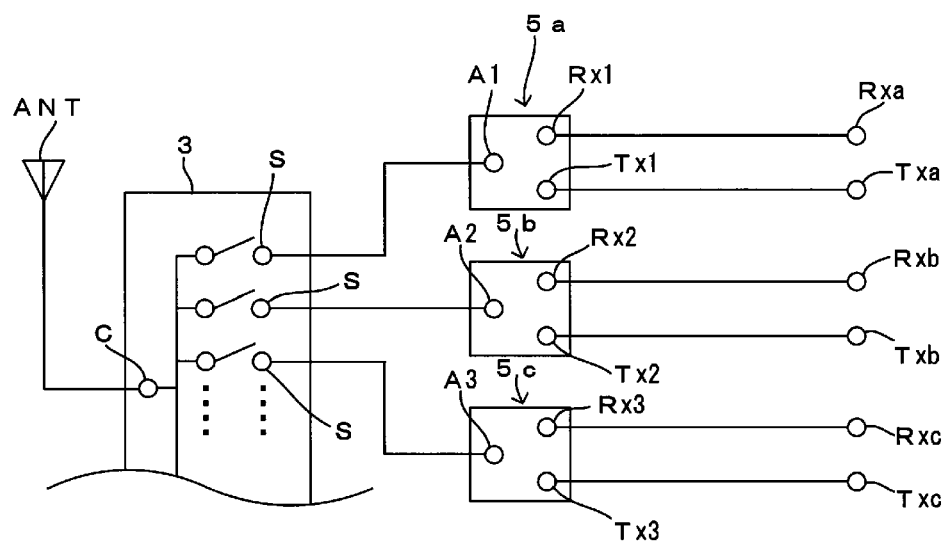
FIG. 4 is a configuration diagram illustrating the high-frequency module illustrated in FIG. 3.

A high-frequency module 1b according to a second preferred embodiment of the present invention will be described with reference to FIGS. 3 and 4. FIG. 3 is a plan view of the high-frequency module 1b, and FIG. 4 is a configuration diagram illustrating the high-frequency module 1b. Note that FIGS. 3 and 4 illustrate only some elements, namely those related to the present preferred embodiment.

The high-frequency module 1b according to the present preferred embodiment differs from the high-frequency module 1a according to the first preferred embodiment described with reference to FIGS. 1 and 2 in that a third duplexer 5c, used for a communication system different from the communication system for which the first duplexer 5a is used and the communication system for which the second duplexer 5b is used, is further provided, as illustrated in FIGS. 3 and 4. The rest of the configuration is preferably the same as that of the high-frequency module 1a according to the first preferred embodiment, and thus descriptions thereof will be omitted by assigning the same reference numerals.

In this case, the third duplexer 5c includes a third transmission terminal Tx3 to which a transmission signal in a third transmission frequency band is inputted, a third common terminal A3 that outputs the transmission signal inputted to the third transmission terminal Tx3 and to which a reception signal in a third reception frequency band is inputted, and a third reception terminal Rx3 that outputs the reception signal inputted to the third common terminal A3. Here, the third common terminal A3 is connected to a predetermined switching terminal S of the switch IC 3 by a wire electrode provided in or on the wiring board 2, the third transmission terminal Tx3 is connected to a third transmission electrode Txc, which is one of the outer electrodes, by an extended line provided in or on the wiring board 2, and the third reception terminal Rx3 is connected to a third reception electrode Rxc, which is also one of the outer electrodes, by an extended line provided in or on the wiring board 2. Note that in this preferred embodiment, the third transmission frequency band is preferably set to about 1920 MHz to about 1980 MHz and the third reception frequency band preferably is set to about 2110 MHz to about 2170 MHz, and the third duplexer 5c is provided for a communication system using what is known as the Band 1 frequency band, for example.

Here, the Band 4 reception frequency band (the second reception frequency band: about 2110 MHz to about 2155 MHz) partially overlaps with the Band 1 reception frequency band (the third reception frequency band: about 2110 MHz to about 2170 MHz). In such a case, when the Band 4 reception signal and the Band 1 reception signal interfere with each other, there is a risk of a drop in the reception sensitivity of the both communication systems. Accordingly, this preferred embodiment prevents a drop in reception sensitivity occurring in the case where reception frequency bands overlap in this manner.

Specifically, the third reception electrode Rxc connected to the third reception terminal Rx3 of the third duplexer 5c by the extended line is disposed in a position, on an outer edge portion of the second main surface of the wiring board 2, that is near the aforementioned opposite side (the side near which the second duplexer 5b is disposed). Additionally, a ground electrode 7, which is one of the outer electrodes, is disposed between the third reception electrode Rxc and the second reception electrode Rxb.

Meanwhile, the third duplexer 5c is disposed near the opposite side on the first main surface of the wiring board 2, and is disposed near the second duplexer 5b. Furthermore, the third reception terminal Rx3 is disposed in a position, in the third duplexer 5c, toward the opposite side.

According to this configuration, the ground electrode is disposed between the second reception electrode Rxb, through which the Band 4 reception signal passes, and the third reception electrode Rxc, through which the Band 1 reception signal that partially overlaps with the frequency band of the reception signal passes. As such, current concentrating in the reception electrodes Rxb and Rxc flows to the ground electrode 7. In this case, concentration of current arising between the reception electrodes Rxb and Rxc is significantly reduced, and mutual interference of the reception signals is able to be prevented. This makes it possible to improve the isolation characteristics between the reception electrodes Rxb and Rxc.

Additionally, by disposing the third duplexer 5c in a position, on the first main surface of the wiring board 2, near the opposite side, the first duplexer 5a and the third duplexer 5c are able to be disposed with sufficient distance therebetween, which makes it possible to improve the isolation characteristics between the duplexers 5a and 5c. Furthermore, the second duplexer 5b and the third duplexer 5c are disposed near each other, and thus the high-frequency module 1b is able to be made smaller.

Note that another outer electrode 6 may be disposed between the reception electrodes Rxb and Rxc instead of the ground electrode 7. In this case, the reception electrodes Rxb and Rxc are able to be spaced from each other, which makes it possible to improve the isolation characteristics between the reception electrodes Rxb and Rxc.

Third Preferred Embodiment

Figure 5:
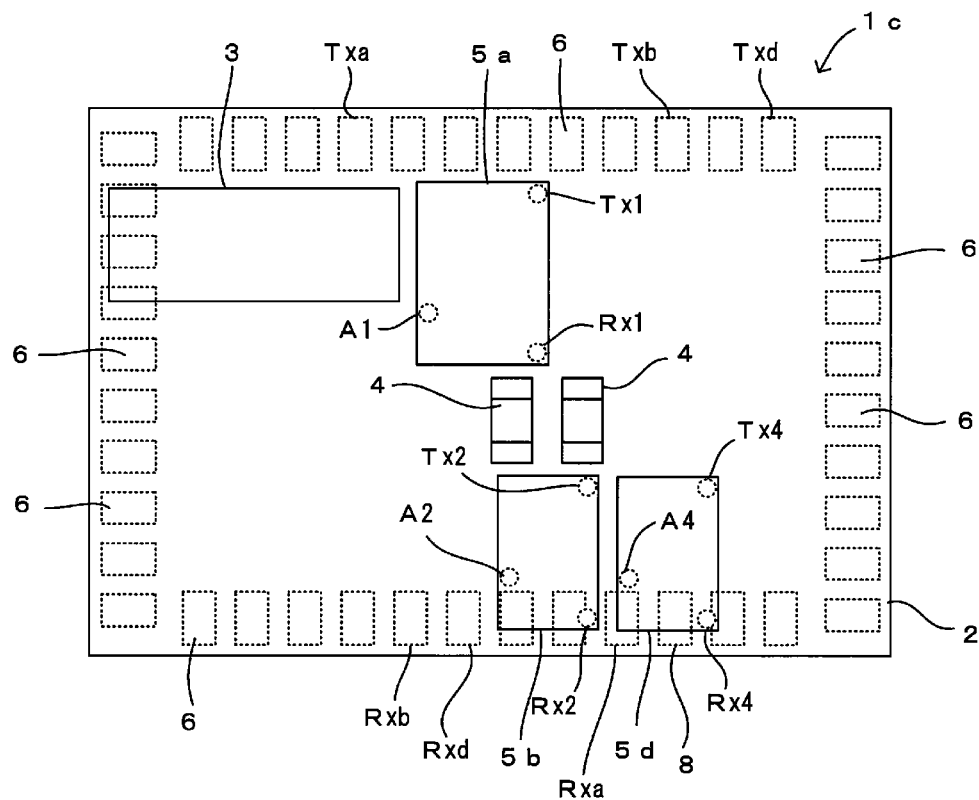
FIG. 5 is a plan view of a high-frequency module according to a third preferred embodiment of the present invention.
Figure 6:
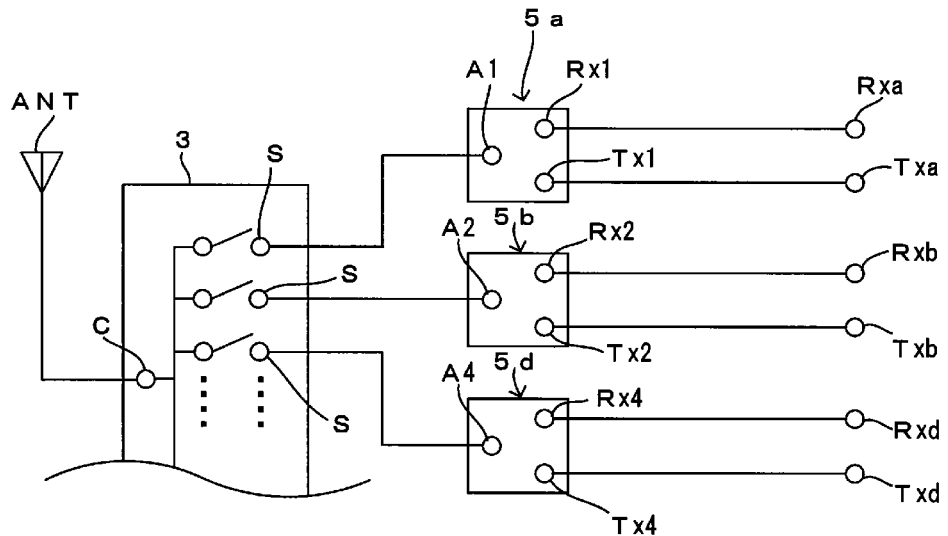
FIG. 6 is a configuration diagram illustrating the high-frequency module illustrated in FIG. 5.

A high-frequency module 1c according to a third preferred embodiment of the present invention will be described with reference to FIGS. 5 and 6. FIG. 5 is a plan view of the high-frequency module 1c, and FIG. 6 is a configuration diagram illustrating the high-frequency module 1c. Note that FIGS. 5 and 6 illustrate only some elements, namely those related to the present preferred embodiment.

The high-frequency module 1c according to the present preferred embodiment differs from the high-frequency module 1a according to the first preferred embodiment described with reference to FIGS. 1 and 2 in that a fourth duplexer 5d, used for a communication system different from the communication system for which the first duplexer 5a is used and the communication system for which the second duplexer 5b is used, is further provided, as illustrated in FIGS. 5 and 6. The rest of the configuration is preferably the same as that of the high-frequency module 1a according to the first preferred embodiment, and thus descriptions thereof will be omitted by assigning the same reference numerals.

In this case, the fourth duplexer 5d is disposed near the opposite side on the first main surface of the wiring board 2, and is disposed near the second duplexer 5b. Additionally, the fourth duplexer 5d includes a fourth transmission terminal Tx4 to which a transmission signal in a fourth transmission frequency band is inputted, a fourth common terminal A4 that outputs the transmission signal inputted to the fourth transmission terminal Tx4 and to which a reception signal in a fourth reception frequency band is inputted, and a fourth reception terminal Rx4 that outputs the reception signal inputted to the fourth common terminal A4.

Here, the fourth common terminal A4 is connected to a predetermined switching terminal S of the switch IC 3 by a wire electrode provided in or on the wiring board 2, the fourth transmission terminal Tx4 is connected to a fourth transmission electrode Txd, which is one of the outer electrodes, by an extended line provided in or on the wiring board 2, and the fourth reception terminal Rx4 is connected to a fourth reception electrode Rxd, which is also one of the outer electrodes, by an extended line provided in or on the wiring board 2. Note that in this preferred embodiment, the fourth transmission frequency band is preferably set to about 1920 MHz to about 1980 MHz and the fourth reception frequency band is preferably set to about 2110 MHz to about 2170 MHz, and the fourth duplexer 5d is provided for a communication system using what is known as the Band 1 frequency band, for example.

Additionally, the fourth common terminal A4 of the fourth duplexer 5d is disposed closer to the switch IC 3 than the fourth reception terminal Rx4, and the fourth reception electrode Rxd is disposed between the fourth common terminal A4 and the switch IC 3 when viewed in plan view (in a position closer to the switch IC 3 than the fourth common terminal A4). In such a case, the extended line that connects the fourth reception terminal Rx4 and the fourth reception electrode Rxd is extended from the fourth reception terminal Rx4 toward the fourth common terminal A4, and thus the distance between the extended line and the fourth common terminal A4 becomes short. Additionally, the reception signal inputted from the fourth common terminal A4 passes through the fourth reception terminal Rx4 and is then led toward the fourth common terminal A4 by the extended line connecting the fourth reception terminal Rx4 and the fourth reception electrode Rxd, and thus that extended line defines a return path for the reception signal.

Additionally, the fourth duplexer 5d is disposed near the opposite side of the wiring board 2, and thus the distance between the extended line from the fourth reception terminal Rx and the outer electrodes disposed in positions, on an outer edge portion of the second main surface of the wiring board 2, that are near the aforementioned opposite side (the second reception electrode Rxb and the first reception electrode Rxa, for example) is shortened. This wiring structure is susceptible to concentrations of current near the fourth reception terminal Rx4, the fourth reception electrode Rxd, and the extended line. In the case where current concentrates, it becomes easy for the transmission signal outputted from the fourth common terminal A4 to leak to the extended line from the fourth reception terminal Rx4, the signal passing through that extended line to leak to connection wires and the like that connect the fourth common terminal A4 and the switch IC 3, and so on, leading to a drop in the isolation characteristics between the transmission and reception terminals of the fourth duplexer 5d. Accordingly, in this preferred embodiment, a ground mounting electrode 8, which is one of the outer electrodes, is disposed between the fourth reception terminal Rx4 and the fourth reception electrode Rxd when viewed in plan view in order to prevent such a drop in isolation characteristics.

With this configuration, current concentrations near the extended line that connects the fourth reception terminal Rx4 and the fourth reception electrode Rxd are reduced by leading the current to the ground through the ground mounting electrode 8, which makes it possible to improve the isolation characteristics between the transmission and reception signals in the fourth duplexer 5d, between the fourth duplexer 5d and the other duplexers 5a and 5b, and so on.

Fourth Preferred Embodiment

Figure 7:
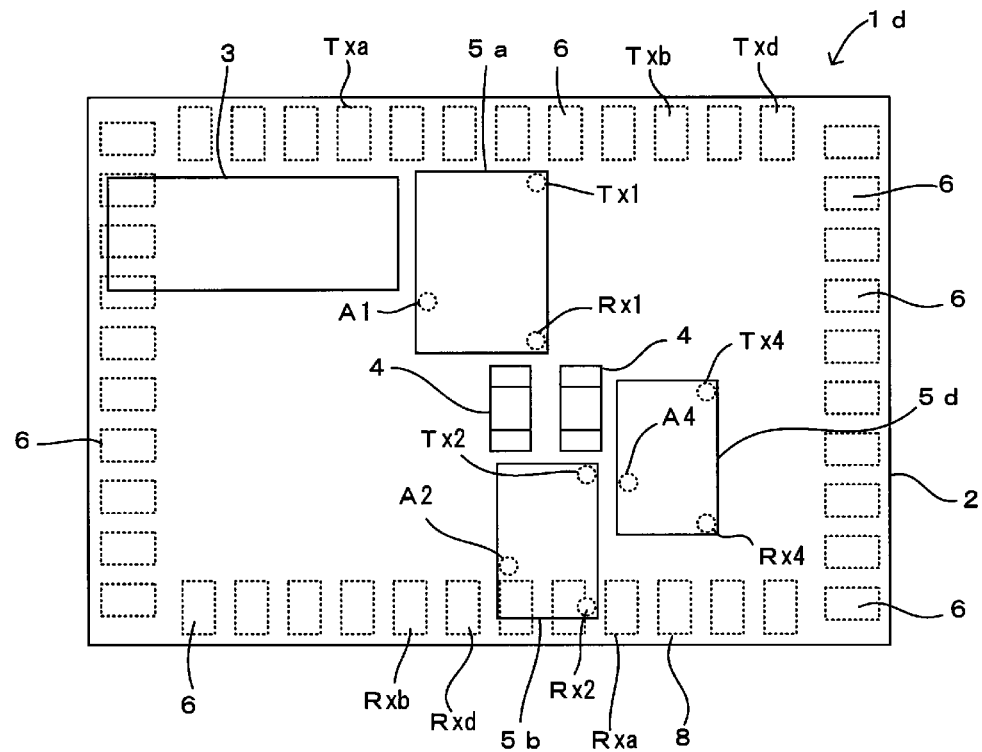
FIG. 7 is a plan view of a high-frequency module according to a fourth preferred embodiment of the present invention.

A high-frequency module 1d according to a fourth preferred embodiment of the present invention will be described with reference to FIG. 7. FIG. 7 is a plan view of the high-frequency module 1d.

The high-frequency module 1d according to this preferred embodiment differs from the high-frequency module 1c according to the third preferred embodiment described with reference to FIGS. 5 and 6 in that the fourth duplexer 5d is disposed at a position farther from the opposite side of the wiring board 2 than the second duplexer 5b, as illustrated in FIG. 7. The rest of the configuration is preferably the same as that of the high-frequency module 1c according to the third preferred embodiment, and thus descriptions thereof will be omitted by assigning the same reference numerals.

According to this configuration, the extended line extending from the fourth reception terminal Rx4 and the outer electrodes disposed near the opposite side of the wiring board 2 (the second reception electrode Rxb and the first reception electrode Rxa, for example) are able to be spaced from each other, which makes it possible to significantly reduce or prevent concentrations of current that cause degradation in isolation characteristics. Note that it is not absolutely necessary to provide the ground mounting electrode 8 in this preferred embodiment.

Fifth Preferred Embodiment

Figure 8:
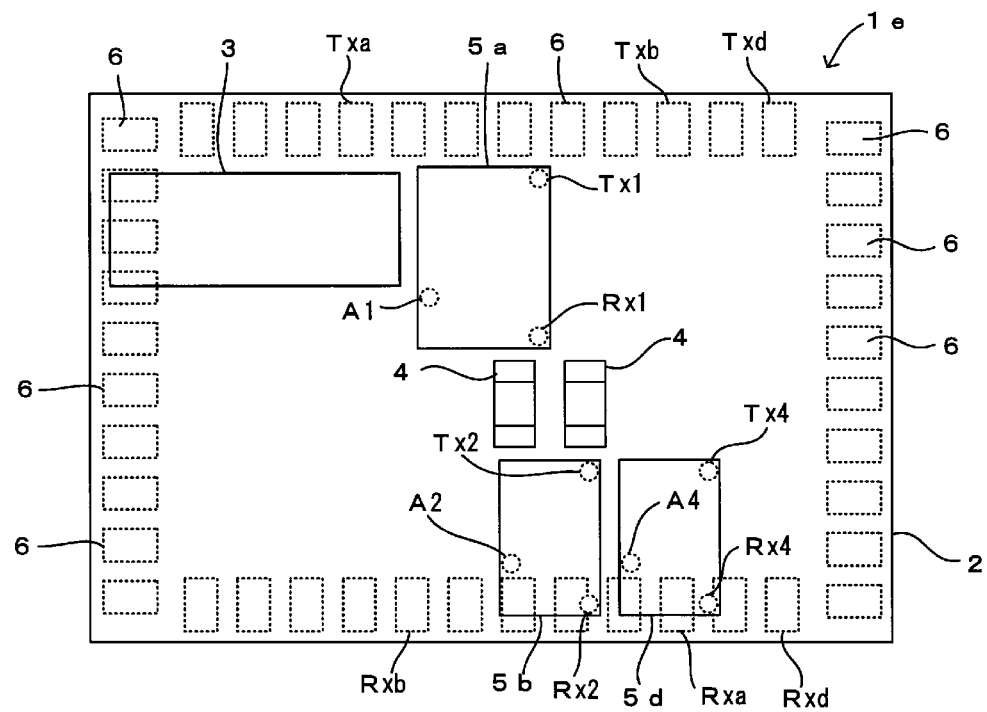
FIG. 8 is a plan view of a high-frequency module according to a fifth preferred embodiment of the present invention.
Figure 9:
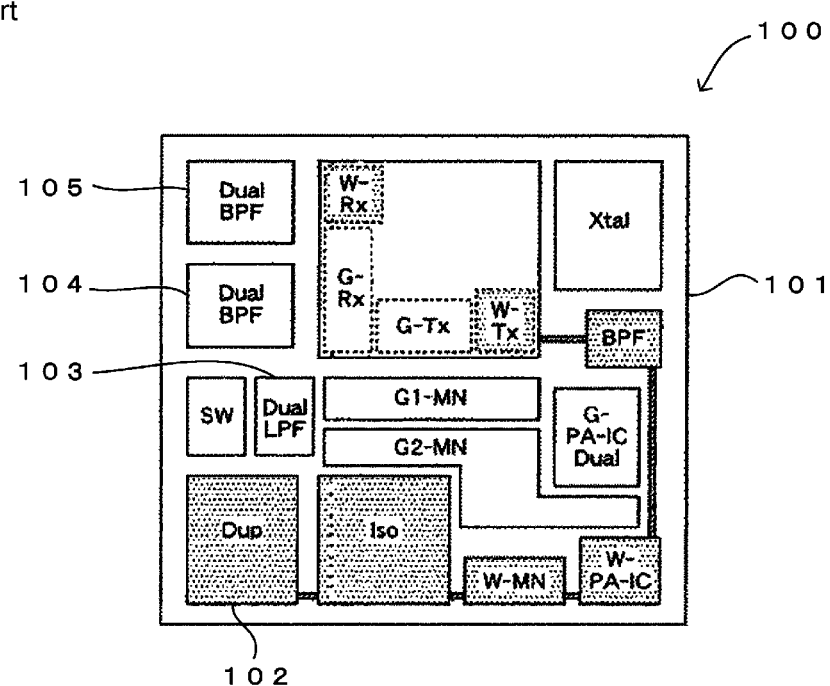
FIG. 9 is a plan view of a conventional high-frequency module.

A high-frequency module 1e according to a fifth preferred embodiment of the present invention will be described with reference to FIG. 8. FIG. 8 is a plan view of the high-frequency module 1e.

The high-frequency module 1e according to this preferred embodiment differs from the high-frequency module 1c according to the third preferred embodiment described with reference to FIGS. 5 and 6 in that the fourth reception electrode Rxd is located farther from the switch IC 3 than the fourth duplexer 5d when viewed in plan view, and the ground mounting electrode 8 is not provided, as illustrated in FIG. 8. The rest of the configuration is preferably the same as that of the high-frequency module 1c according to the third preferred embodiment, and thus descriptions thereof will be omitted by assigning the same reference numerals.

In this case, the extended line from the fourth reception terminal Rx4 is not extended toward the fourth common terminal A4 as in the high-frequency module 1c according to the third preferred embodiment, and is instead spaced away from the fourth common terminal A4. With this configuration, current concentrations near the extended line that connects the fourth reception terminal Rx4 and the fourth reception electrode Rxd are significantly reduced or prevented, which makes it possible to improve the isolation characteristics between the transmission and reception signals in the fourth duplexer 5d, between the fourth duplexer 5d and the other duplexers 5a and 5b, and so on.

Note that in this preferred embodiment, the fourth duplexer 5d corresponds to a "fifth duplexer" according to a preferred embodiment of the present invention; the frequency bands of the communication signal (Band 1) in the communication system in which the fourth duplexer 5d is used (transmission side: about 1920 MHz to about 1980 MHz; reception side: about 2110 MHz to about 2170 MHz) respectively correspond to a "fifth transmission frequency band" and a "fifth reception frequency band" according to a preferred embodiment of the present invention; the fourth common terminal A4 corresponds to a "fifth common terminal" according to a preferred embodiment of the present invention; the fourth transmission terminal Tx4 corresponds to a "fifth transmission terminal" according to a preferred embodiment of the present invention; the fourth reception terminal Rx4 corresponds to a "fifth reception terminal" according to a preferred embodiment of the present invention; and the fourth reception electrode Rxd corresponds to a "fifth reception electrode" according to a preferred embodiment of the present invention.

Note that the present invention is not intended to be limited to the above-described preferred embodiments, and many changes aside from the content described above can be made without departing from the essential spirit of the present invention. For example, the first preferred embodiment describes the Band 17 and Band 4 as examples of the first transmission frequency band and the second reception frequency band that partially overlaps with a frequency band of a harmonic of the first transmission frequency band, respectively, the bands may be changed as appropriate as long as there is a similar frequency band relationship. The same applies in the case where the second reception frequency band and the third reception frequency band partially overlap in the second preferred embodiment.

Additionally, the high-frequency modules 1a-1e may further include a power amp to amplify the transmission signal. For example, in the case where the configuration is such that a power amp is connected to the first transmission terminal Tx1 of the first duplexer 5a, an extended line connecting the first transmission terminal Tx1 to the power amp and an extended line from the second reception terminal Rx2 of the second duplexer 5b may be spaced away from each other.

Additionally, the mounted components disposed between the first duplexer 5a and the second duplexer 5b are not limited to the above-described chip components 4, and may be ICs instead.

Preferred embodiments of the present invention are able to be broadly applied in high-frequency modules in which a plurality of duplexers are mounted on a wiring board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a wiring board;
   a first duplexer including a first transmission terminal to which a transmission signal in a first transmission frequency band is inputted, a first common terminal that outputs the transmission signal inputted to the first transmission terminal and to which a reception signal in a first reception frequency band is inputted, and a first reception terminal that outputs the reception signal inputted to the first common terminal; and
   a second duplexer including a second transmission terminal to which a transmission signal in a second transmission frequency band is inputted, a second common terminal that outputs the transmission signal inputted to the second transmission terminal and to which a reception signal in a second reception frequency band is inputted, and a second reception terminal that outputs the reception signal inputted to the second common terminal; wherein
   the second reception frequency band partially overlaps with a frequency band of a harmonic of the transmission signal in the first transmission frequency band;
   the frequency band of the harmonic of the transmission signal in the first transmission frequency band is higher than a fundamental frequency of the first transmission frequency band;
   the first duplexer is located toward a first side on a first main surface of the wiring board, and the second duplexer is located on the first main surface of the wiring board toward a second side opposite the first side; and
   an extended line extending from the first transmission terminal and an extended line extending from the second reception terminal, located in or on the wiring board, are spaced away from each other.

2. The high-frequency module according to claim 1, further comprising:
   a first transmission electrode located on a second main surface of the wiring board and connected to the extended line extending from the first transmission terminal; and
   a second reception electrode located on the second main surface of the wiring board and connected to the extended line extending from the second reception terminal; wherein
   the first transmission electrode is located toward the first side of the wiring board; and
   the second reception electrode is located toward the second side of the wiring board.

3. The high-frequency module according to claim 2, further comprising:
   a third duplexer including a third transmission terminal to which a transmission signal in a third transmission frequency band is inputted, a third common terminal that outputs the transmission signal inputted to the third transmission terminal and to which a reception signal in a third reception frequency band is inputted, and a third reception terminal that outputs the reception signal inputted to the third common terminal;
   a third reception electrode located on the second main surface of the wiring board and electrically connected to the third reception terminal; and
   a ground electrode located on the second main surface of the wiring board; wherein
   the second reception frequency band and the third reception frequency band partially overlap; and
   the ground electrode is located between the second reception electrode and the third reception electrode.

4. The high-frequency module according to claim 3, wherein the third duplexer is located on the first main surface of the wiring board toward the second side.

5. The high-frequency module according to claim 3, wherein the second duplexer and the third duplexer are located near or in a vicinity of each other.

6. The high-frequency module according to claim 1, wherein the first transmission terminal is located toward the first side of the wiring board, and the second reception terminal is located toward the second side of the wiring board.

7. The high-frequency module according to claim 1, further comprising:
   a fourth duplexer including a fourth transmission terminal to which a transmission signal in a fourth transmission frequency band is inputted, a fourth common terminal that outputs the transmission signal inputted to the fourth transmission terminal and to which a reception signal in a fourth reception frequency band is inputted, and a fourth reception terminal that outputs the reception signal inputted to the fourth common terminal;
a switch IC located on the first main surface of the wiring board and electrically connected to the fourth common terminal;
a fourth reception electrode located on the second main surface of the wiring board and electrically connected to the fourth reception terminal; and
a ground mounting electrode located on the second main surface of the wiring board; wherein
the fourth common terminal is located closer to the switch IC than the fourth reception terminal;
the fourth reception electrode is located between the fourth common terminal and the switch IC when viewed in plan view; and
the ground mounting electrode is located between the fourth reception terminal and the fourth reception electrode when viewed in plan view.

8. The high-frequency module according to claim 7, wherein
the fourth reception electrode is located toward the second side of the wiring board; and
the fourth duplexer is located farther from the second side of the wiring board than the second duplexer.

9. The high-frequency module according to claim 1, further comprising:
a fifth duplexer including a fifth transmission terminal to which a transmission signal in a fifth transmission frequency band is inputted, a fifth common terminal that outputs the transmission signal inputted to the fifth transmission terminal and to which a reception signal in a fifth reception frequency band is inputted, and a fifth reception terminal that outputs the reception signal inputted to the fifth common terminal;
a switch IC located on the first main surface of the wiring board and electrically connected to the fifth common terminal; and
a fifth reception electrode located on the second main surface of the wiring board and electrically connected to the fifth reception terminal; wherein
the fifth common terminal is located closer to the switch IC than the fifth reception terminal; and
the fifth reception electrode is located farther from the switch IC than the fifth duplexer when viewed in plan view.

10. The high-frequency module according to claim 1, wherein a component is located between the first duplexer and the second duplexer.

11. The high-frequency module according to claim 1, wherein the wiring board is rectangular or substantially rectangular when viewed in plan view.

12. The high-frequency module according to claim 1, wherein the high-frequency module is a front end module of a communication device.

13. The high-frequency module according to claim 12, wherein the high-frequency module performs communication using carrier aggregation.

14. The high-frequency module according to claim 1, further comprising an impedance matching circuit located on the first main surface of the wiring board.

15. The high-frequency module according to claim 14, wherein the impedance matching circuit is located between the first and second duplexers.

16. The high-frequency module according to claim 14, wherein the impedance matching circuit includes chip inductors and chip capacitors.

17. The high-frequency module according to claim 14, further comprising a switch IC on the first main surface of the wiring board, wherein the impedance matching circuit is connected to perform impedance matching at least one of between the first duplexer and the switch IC, and between the second duplexer and the switch IC.

18. A communication device comprising:
an antenna; and
a front end module defined by the high-frequency module according to claim 1 connected to the antenna.

19. The communication device according to claim 18, wherein the communication device is a cellular phone.

20. The communication device according to claim 18, wherein the high-frequency module performs communication using carrier aggregation.

* * * * *